(12) United States Patent
Rehder

(10) Patent No.: US 12,003,210 B2
(45) Date of Patent: Jun. 4, 2024

(54) SOLAR ARRAY ATTACHMENT

(71) Applicant: The Boeing Company, Chicago, IL (US)

(72) Inventor: Eric M. Rehder, Los Angeles, CA (US)

(73) Assignee: THE BOEING COMPANY, Arlington, VA (US)

(*) Notice: Subject to any disclaimer, the term of this patent is extended or adjusted under 35 U.S.C. 154(b) by 0 days.

(21) Appl. No.: 16/847,032

(22) Filed: Apr. 13, 2020

(65) Prior Publication Data
US 2021/0320618 A1 Oct. 14, 2021

(51) Int. Cl.
*H02S 30/10* (2014.01)
*H02S 40/42* (2014.01)

(52) U.S. Cl.
CPC ............. *H02S 30/10* (2014.12); *H02S 40/42* (2014.12)

(58) Field of Classification Search
CPC ............. H01L 31/00–208; H02S 40/42; Y02E 10/50–56
See application file for complete search history.

(56) References Cited

U.S. PATENT DOCUMENTS

| | | | |
|---|---|---|---|
| 3,376,164 A | 4/1968 | Bachwansky | |
| 3,620,847 A * | 11/1971 | Wise | B64G 1/443 257/446 |
| 3,833,426 A | 9/1974 | Mesch | |
| 4,057,439 A | 11/1977 | Lindmayer | |
| 4,101,101 A | 7/1978 | Barkats et al. | |
| 4,257,821 A | 3/1981 | Kelly et al. | |
| 4,481,378 A | 11/1984 | Lesk | |
| 4,755,231 A | 7/1988 | Kurland et al. | |
| 5,330,583 A | 7/1994 | Asai et al. | |
| 5,520,747 A * | 5/1996 | Marks | B64G 1/443 136/246 |
| 5,567,248 A | 10/1996 | Chung | |
| 6,008,448 A | 12/1999 | Peck | |
| 6,313,396 B1 | 11/2001 | Glenn | |
| 6,350,944 B1 | 2/2002 | Sherif et al. | |

(Continued)

FOREIGN PATENT DOCUMENTS

| | | |
|---|---|---|
| CN | 103155158 A | 6/2013 |
| CN | 203277428 U | 11/2013 |

(Continued)

OTHER PUBLICATIONS

Extended European Search Report dated Apr. 29, 2021 for EP Application No. 21164063.6.

(Continued)

*Primary Examiner* — Eli S Mekhlin
(74) *Attorney, Agent, or Firm* — GATES & COOPER LLP

(57) ABSTRACT

A solar array including at least one solar panel comprised of a substrate having one or more solar cells bonded thereto, and a frame for supporting the substrate and the solar cells, wherein the substrate is attached to the frame at a perimeter of the frame along one or more edges of the substrate, the frame has a cutout or opening in a center of the frame under the solar cells, and the cutout or opening enables direct cooling of the solar cells through the substrate by exposing a back side of the substrate for transferring or radiating heat directly through the cutout or opening of the frame.

20 Claims, 14 Drawing Sheets

(56) References Cited

U.S. PATENT DOCUMENTS

| | | | |
|---|---|---|---|
| 6,441,297 B1 | 8/2002 | Keller et al. | |
| 6,528,716 B2 * | 3/2003 | Collette | B64G 1/443 |
| | | | 136/246 |
| 6,543,725 B1 | 4/2003 | Meurer et al. | |
| 6,555,739 B2 | 4/2003 | Kawam | |
| 6,637,702 B1 | 10/2003 | McCandless | |
| 8,814,099 B1 | 8/2014 | Harvey et al. | |
| 9,120,583 B1 | 9/2015 | Spence et al. | |
| 9,758,261 B1 | 9/2017 | Steinfeldt | |
| 10,189,582 B1 | 1/2019 | Spence et al. | |
| 2002/0007845 A1 * | 1/2002 | Collette | H02S 30/20 |
| | | | 136/246 |
| 2003/0057533 A1 | 3/2003 | Lemmi et al. | |
| 2004/0118446 A1 | 6/2004 | Toyomura | |
| 2005/0133079 A1 | 6/2005 | Boulanger et al. | |
| 2007/0152194 A1 | 7/2007 | Natekar et al. | |
| 2008/0295889 A1 | 12/2008 | Schindler et al. | |
| 2009/0183760 A1 | 7/2009 | Meyer | |
| 2009/0255571 A1 | 10/2009 | Xia et al. | |
| 2009/0272436 A1 | 11/2009 | Cheung | |
| 2010/0012172 A1 | 1/2010 | Meakin et al. | |
| 2010/0089435 A1 | 4/2010 | Lockenhoff | |
| 2010/0126560 A1 | 5/2010 | Lauvray et al. | |
| 2010/0186795 A1 | 7/2010 | Gaul | |
| 2010/0212741 A1 | 8/2010 | Lin | |
| 2011/0041890 A1 | 2/2011 | Sheats | |
| 2011/0073163 A1 | 3/2011 | Cheung | |
| 2011/0079263 A1 | 4/2011 | Avrutsky | |
| 2011/0168238 A1 | 7/2011 | Metin et al. | |
| 2011/0198444 A1 * | 8/2011 | Dong | B64D 41/00 |
| | | | 244/130 |
| 2011/0210209 A1 | 9/2011 | Taylor et al. | |
| 2012/0103388 A1 | 5/2012 | Meakin et al. | |
| 2012/0161801 A1 | 6/2012 | Hasegawa | |
| 2012/0199176 A1 | 8/2012 | Hong et al. | |
| 2012/0313455 A1 | 12/2012 | Latham | |
| 2013/0014802 A1 | 1/2013 | Zimmerman | |
| 2013/0056047 A1 * | 3/2013 | Beck | H02S 30/10 |
| | | | 136/251 |
| 2013/0263915 A1 | 10/2013 | Snidow | |
| 2014/0000682 A1 | 1/2014 | Zhao | |
| 2014/0033625 A1 | 2/2014 | Jenkins et al. | |
| 2014/0083497 A1 | 3/2014 | Ehrenpfordt et al. | |
| 2014/0166067 A1 | 6/2014 | McGlynn et al. | |
| 2014/0255780 A1 | 9/2014 | Mikhaylik et al. | |
| 2014/0366927 A1 | 12/2014 | Lavrova et al. | |
| 2015/0083191 A1 | 3/2015 | Gmundner | |
| 2015/0096607 A1 | 4/2015 | Yong | |
| 2015/0287862 A1 | 10/2015 | Pardell Vilella | |
| 2015/0349703 A1 | 12/2015 | Morad et al. | |
| 2016/0112004 A1 | 4/2016 | Thiel et al. | |
| 2016/0126380 A1 | 5/2016 | Chang | |
| 2016/0197207 A1 | 7/2016 | Morioka et al. | |
| 2016/0218665 A1 | 7/2016 | Crist | |
| 2017/0040933 A1 | 2/2017 | Vogel | |
| 2017/0054406 A1 | 2/2017 | Narla et al. | |
| 2017/0098736 A1 | 4/2017 | Lee et al. | |
| 2017/0229692 A1 | 8/2017 | Thiel et al. | |
| 2017/0374737 A1 | 12/2017 | Jeong et al. | |
| 2019/0127089 A1 | 5/2019 | Tomoda et al. | |
| 2019/0140584 A1 | 5/2019 | Hayashi et al. | |
| 2019/0305719 A1 | 10/2019 | Rehder | |
| 2019/0305723 A1 | 10/2019 | Rehder | |
| 2021/0320619 A1 * | 10/2021 | Rehder | H01L 31/02013 |

FOREIGN PATENT DOCUMENTS

| | | |
|---|---|---|
| CN | 104241406 A | 12/2014 |
| CN | 104443439 A | 3/2015 |
| DE | 10136442 | 2/2003 |
| DE | 10136442 A1 | 2/2003 |
| EP | 3562032 A1 | 10/2019 |
| JP | 2002190612 A * | 7/2002 |
| JP | 2011071214 | 4/2011 |
| KR | 970026308 A * | 6/1997 |

OTHER PUBLICATIONS

Extended European Search Report dated May 3, 2021 for EP Application No. 21164064.4.
Non-Final Office Action dated Feb. 18, 2021 for U.S. Appl. No. 15/938,791.
Non-Final Office Action dated Jan. 7, 2021 for U.S. Appl. No. 15/787,291.
Non-Final Office Action dated Feb. 1, 2021 for U.S. Appl. No. 15/643,277.
Non-Final Office Action dated Dec. 7, 20 for U.S. Appl. No. 15/787,304.
Lyons, J.W., "SMEX-Lite Modular Solar Array Architecture," 2002 37th Intersociety Energy Conversion Engineering Conference (IECEC), pp. 204-208.
Lyons, J.W., https://slideplayer.com/slide/8876116/, NASA SMEX-Lite Online presentation, pp. 1-6, as downloaded Apr. 13, 2020.
"Space Exploration BETA", https://space.stackexchange.com/questions/8066/why-does-dscovr-appear-to-be-missing-solar-cells, Image of build solar panels, including backside, as downloaded Apr. 13, 2020.
Final Office Action dated Mar. 12, 2021 for U.S. Appl. No. 15/643,282.
Non-Final Office Action dated Dec. 22, 2020 for U.S. Appl. No. 15/643,285.
Final Office Action dated Jun. 1, 2021 for U.S. Appl. No. 15/643,277.
Non-Final Office Action dated May 12, 2021 for U.S. Appl. No. 15/643,274.
Non-Final Office Action dated Apr. 27, 2021 for U.S. Appl. No. 15/938,787.
Final Office Action dated Mar. 5, 2021 for U.S. Appl. No. 15/643,279.
Final Office Action dated Apr. 22, 2021 for U.S. Appl. No. 15/643,285.
Non-Final Office Action dated Nov. 9, 2020 for U.S. Appl. No. 15/643,282.
Non-Final Office Action dated Sep. 29, 2021 for U.S. Appl. No. 15/643,289.
Non-Final Office Action dated Sep. 17, 2021 for U.S. Appl. No. 15/643,277.
Non-Final Office Action dated Aug. 18, 2021 for U.S. Appl. No. 15/643,285.
Non-Final Office Action dated Aug. 18, 2021 for U.S. Appl. No. 15/787,291.
Non-Final Office Action dated Aug. 18, 2021 for U.S. Appl. No. 15/787,304.
Final Office Action dated Aug. 13, 2021 for U.S. Appl. No. 15/938,791.
Non-Final Office Action dated Aug. 2, 2021 for U.S. Appl. No. 15/643,282.
Final Office Action dated Dec. 1, 2022 for U.S. Appl. No. 15/643,277.
Final Office Action dated Feb. 6, 2023 for U.S. Appl. No. 17/100,823.
Final Office Action dated Jun. 3, 2022 for U.S. Appl. No. 15/643,279.
Final Office Action dated Apr. 18, 2023 for U.S. Appl. No. 16/991,589.
Non-Final Office Action dated Sep. 21, 2022 for U.S. Appl. No. 17/100,823.
Final Office Action dated Feb. 14, 2022 for U.S. Appl. No. 16/847,359.
Final Office Action dated Feb. 24, 2022 for U.S. Appl. No. 15/643,277.
Non-Final Office Action dated Dec. 22, 2022 for U.S. Appl. No. 15/938,787.
Non-Final Office Action dated Jul. 1, 2022 for U.S. Appl. No. 15/643,277.
Notice of Allowance dated Jun. 23, 2022 for U.S. Appl. No. 16/847,359.
Final Office Action dated Dec. 28, 2021 for U.S. Appl. No. 15/643,282.
Non-Final Office Action dated Sep. 23, 2022 for U.S. Appl. No. 16/991,589.
Final Office Action dated Jan. 20, 2022 for U.S. Appl. No. 15/643,285.

(56) References Cited

OTHER PUBLICATIONS

Non-Final Office Action dated Nov. 14, 2022 for U.S. Appl. No. 15/643,285.
Final Office Action dated Jun. 22, 2023 for U.S. Appl. No. 15/938,787.
Non-Final Office Action dated Sep. 15, 2022 for U.S. Appl. No. 16/543,279.
Non-Final Office Action dated May 11, 2023 for U.S. Appl. No. 15/643,277.
Final Office Action dated Mar. 31, 2023 for U.S. Appl. No. 15/643,279.
Non-Final Office Action dated Apr. 19, 2023 for U.S. Appl. No. 15/787,304.
Non-Final Office Action dated Dec. 23, 2022 for U.S. Appl. No. 17/878,348.
Non-Final Office Action dated Mar. 14, 2022 for U.S. Appl. No. 15/643,282.
Non-Final Office Action dated Dec. 6, 2021 for U.S. Appl. No. 15/643,279.
Final Office Action dated Dec. 9, 2021 for U.S. Appl. No. 15/938,787.
Final Office Action dated Jun. 15, 2023 for U.S. Appl. No. 15/643,285.
Non-Final Office Action dated Dec. 20, 2022 for U.S. Appl. No. 15/643,282.
Notice of Allowance dated Apr. 20, 2022 for U.S. Appl. No. 15/643,289.
Non-Final Office Action dated May 5, 2023 for U.S. Appl. No. 15/787,291.
Final Office Action dated Dec. 17, 2021 for U.S. Appl. No. 15/787,291.
Final Office Action dated Dec. 15, 2021 for U.S. Appl. No. 15/787,304.
Final Office Action dated Jun. 27, 2023 for U.S. Appl. No. 15/643,282.
Non-Final Office Action dated Sep. 13, 2023 for U.S. Appl. No. 15/643,279.
Final office Action dated Jul. 7, 2023 for U.S. Appl. No. 17/878,348.
Final Office Action dated Sep. 11, 2023 for U.S. Appl. No. 15/787,291.
Final Office Action dated Aug. 25, 2022 for U.S. Appl. No. 15/643,282.
Non-Final Office Action dated Sep. 20, 2023 for U.S. Appl. No. 16/991,589.
Non-Final Office Action dated Aug. 4, 2023 for U.S. Appl. No. 17/100,823.
Final Office Action dated Oct. 10, 2023 for U.S. Appl. No. 15/938,791.
Non-Final Office Action dated Oct. 25, 2023 for U.S. Appl. No. 15/643,274.
Non-Final Office Action dated Oct. 26, 2023 for U.S. Appl. No. 17/878,348.
Final Office Action dated Nov. 15, 2023 for U.S. Appl. No. 15/643,277.
Non-Final Office Action dated Nov. 9, 2023 for U.S. Appl. No. 15/643,282.
Non-Final Office Action dated Dec. 27, 2023 for U.S. Appl. No. 15/787,291.
Final Office Action dated Jan. 9, 2024 for U.S. Appl. No. 17/100,823.
Non-Final Office Action dated Jan. 26, 2024 for U.S. Appl. No. 15/787,304.
Non-Final Office Action dated Feb. 8, 2024 for U.S. Appl. No. 15/938,791.
Final Office Action dated Mar. 4, 2024 for U.S. Appl. No. 15/643,279.
Final Office Action dated Mar. 14, 2024 for U.S. Appl. No. 16/991,589.
Notice of Allowance dated Mar. 20, 2024 for U.S. Appl. No. 17/878,348.

* cited by examiner

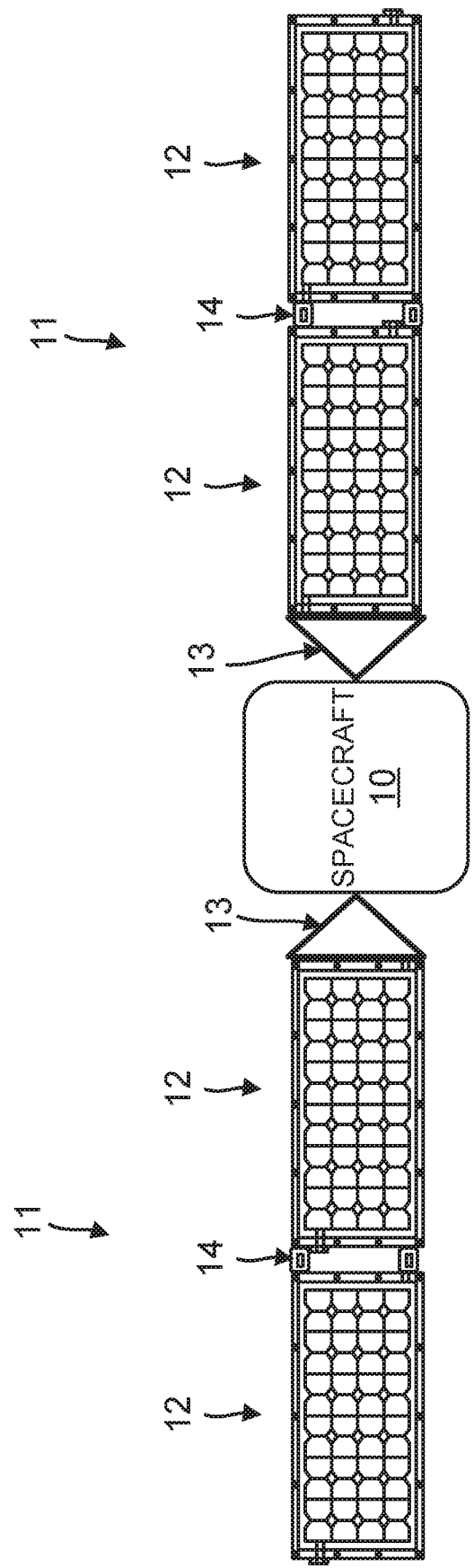

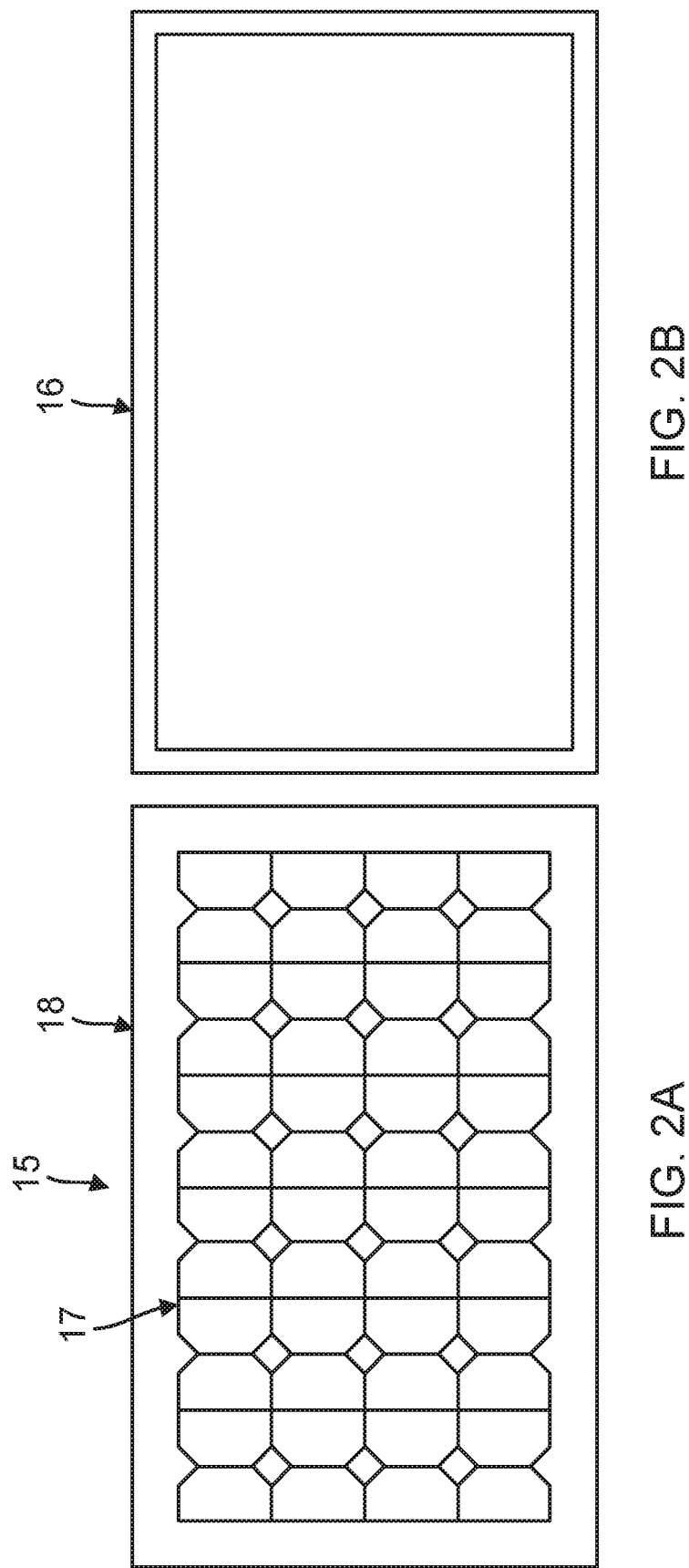

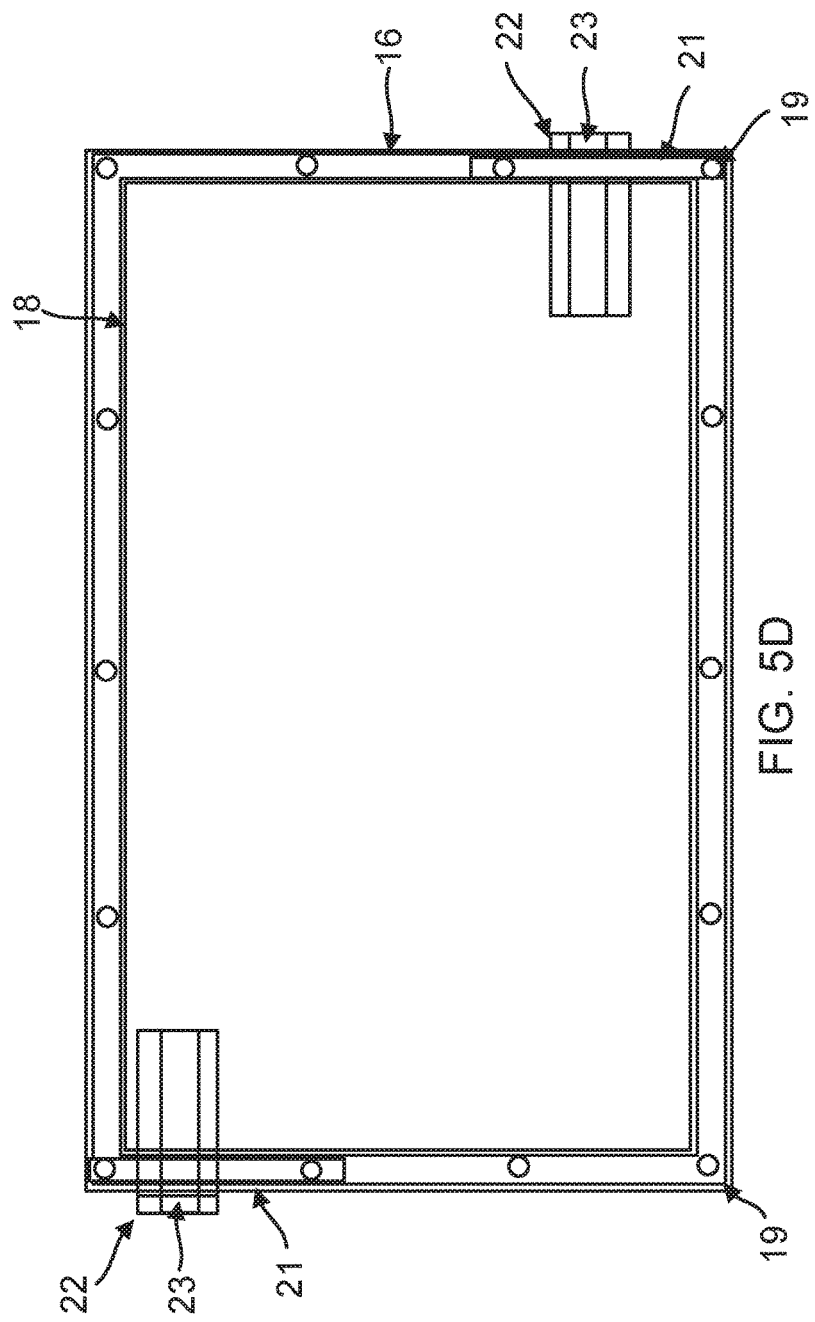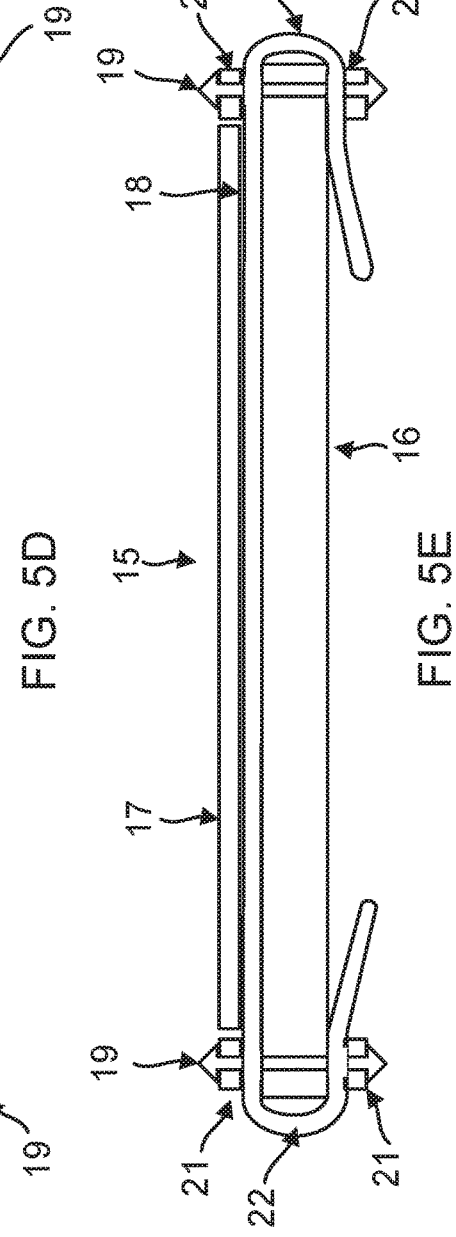

SOLAR ARRAY ATTACHMENT

CROSS REFERENCE TO RELATED APPLICATIONS

This application is related to the following commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS,";

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY,";

U.S. Utility application Ser. No. 15/643,279, filed on Jul. 6, 2017, by Eric Rehder, entitled "REWORK AND REPAIR OF COMPONENTS IN A SOLAR ARRAY,";

U.S. Utility application Ser. No. 15/643,282, filed on Jul. 6, 2017, by Eric Rehder, entitled "POWER ROUTING MODULE FOR A SOLAR ARRAY,";

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY,";

U.S. Utility application Ser. No. 15/643,287, filed on Jul. 6, 2017, by Eric Rehder, entitled "NANO-METAL CONNECTIONS FOR A SOLAR CELL ARRAY,"; and U.S. Utility application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY,";

all of which applications claim the benefit under 35 U.S.C. Section 119(e) of the following commonly-assigned provisional applications:

U.S. Provisional Application Ser. No. 62/394,636, filed on Sep. 14, 2016, by Eric Rehder, entitled "SOLAR CELL ARRAY CONNECTIONS,";

U.S. Provisional Application Ser. No. 62/394,616, filed on Sep. 14, 2016, by Eric Rehder, entitled "CORNER CONNECTORS FOR A SOLAR CELL ARRAY,";

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY,";

U.S. Provisional Application Ser. No. 62/394,627, filed on Sep. 14, 2016, by Eric Rehder, entitled "SELECT CURRENT PATHWAYS IN A SOLAR CELL ARRAY,");

U.S. Provisional Application Ser. No. 62/394,629, filed on Sep. 14, 2016, by Eric Rehder, entitled "MULTILAYER CONDUCTORS IN A SOLAR CELL ARRAY,";

U.S. Provisional Application Ser. No. 62/394,632, filed on Sep. 14, 2016, by Eric Rehder, entitled "REWORK AND REPAIR OF COMPONENTS IN A SOLAR CELL ARRAY,";

U.S. Provisional Application Ser. No. 62/394,649, filed on Sep. 14, 2016, by Eric Rehder, entitled "POWER ROUTING MODULE FOR A SOLAR CELL ARRAY,";

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,";

U.S. Provisional Application Ser. No. 62/394,667, filed on Sep. 14, 2016, by Eric Rehder, entitled "NANO-METAL CONNECTIONS FOR A SOLAR CELL ARRAY,";

U.S. Provisional Application Ser. No. 62/394,671, filed on Sep. 14, 2016, by Eric Rehder, entitled "BACK CONTACTS FOR A SOLAR CELL ARRAY,";

U.S. Provisional Application Ser. No. 62/394,641, filed on Sep. 14, 2016, by Eric Rehder, entitled "PRINTED CONDUCTORS IN A SOLAR CELL ARRAY,"; and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY,";

all of which applications are incorporated by reference herein.

This application also is related to the following commonly-assigned applications:

U.S. Utility application Ser. No. 15/787,291, filed on Oct. 18, 2017, by Eric Rehder, entitled "SOLAR CELL ARRAY WITH CHANGEABLE STRING LENGTH,"; and U.S. Utility application Ser. No. 15/787,304, filed on Oct. 18, 2017, by Eric Rehder, entitled "SOLAR CELL ARRAY WITH BYPASSED SOLAR CELLS,"; both of which applications claim the benefit under 35 U.S.C. Section 119(e) of commonly-assigned provisional applications:

U.S. Provisional Application Ser. No. 62/518,125, filed on Jun. 12, 2017, by Eric Rehder, entitled "SOLAR CELL ARRAY WITH CHANGEABLE STRING LENGTH,"; and U.S. Provisional Application Ser. No. 62/518,131, filed on Jun. 12, 2017, by Eric Rehder, entitled "SOLAR CELL ARRAY WITH BYPASSED SOLAR CELLS,";

both of which applications are incorporated by reference herein.

In addition, this application is related to the following commonly-assigned applications:

U.S. Utility application Ser. No. 15/938,787, filed on Mar. 28, 2018, by Eric Rehder, entitled "SINGLE SHEET FOLD-OUT SOLAR ARRAY,"; and U.S. Utility application Ser. No. 15/938,791, filed on Mar. 28, 2019, by Eric Rehder, entitled "WIRING FOR A RIGID PANEL SOLAR ARRAY,";

all of which applications are incorporated by reference herein.

Finally, this application is related to the following commonly-assigned application:

U.S. Utility Application Ser. No. 16/847,359, filed on Apr. 13, 2020, by Eric Rehder, entitled "STACKED SOLAR ARRAY,";

which application is incorporated by reference herein.

BACKGROUND INFORMATION

1. Field

The disclosure is related generally to solar cell panels and more specifically to a solar array attachment.

2. Background

A spacecraft often uses solar arrays for electric power generation. A solar array generally is comprised of solar panels connected together, wherein each solar panel is populated with solar cells to generate the electric power. Usually, there is wiring across the solar panels to carry the electric power to the spacecraft.

Solar cells and their assemblies need to radiate heat away from the Sun to cool. As solar cells are built up into a solar array, the solar cells need to maintain high thermal conductivity to a radiating surface.

It is also desirable to build solar cells onto a thin substrate to achieve low cost manufacturing. This substrate could be a plastic sheet such as polyimide, a thin fiber composite, or thin metal sheet. This substrate has lateral strength, but is thin, lightweight, and likely flexible.

In addition, it is desirable to have a solar array based on rigid panels. This panel has more strength to deliver the rigidity and frequency response needed for the program. The panel is often an aluminum (Al) honeycomb with carbon composite face sheets. Thus, it is desirable to attach the thin substrate with the solar cells to a rigid panel.

However, this attachment requires a large area adhesive bond to ensure thermal contact to the rigid panel radiating surface. The large area adhesive bond is a large mass of material, which is undesirable for space applications.

Also, it is difficult to attach two flat surfaces of the substrate and rigid panel together without having trapped air. This trapped air will cause delamination or blowout when this assembly goes into a vacuum environment of space.

What is needed, then, is a means for simplifying the design and manufacturing, of solar arrays.

SUMMARY

To overcome the limitations described above, and to overcome other limitations that will become apparent upon reading and understanding the present specification, the present disclosure describes a solar array including at least one solar panel comprised of a substrate having one or more solar cells bonded thereto, and a frame for supporting the substrate and the solar cells, wherein the substrate is attached to the frame at a perimeter of the frame along one or more edges of the substrate, the frame has a cutout or opening under the solar cells, and the cutout or opening enables direct cooling of the solar cells through the substrate by exposing a back side of the substrate for transferring or radiating heat directly through the cutout or opening of the frame.

DRAWINGS

Referring now to the drawings in which like reference numbers represent corresponding parts throughout:

FIG. 1 is a schematic of a spacecraft with one or more solar arrays comprised of one or more solar panels.

FIGS. 2A, 2B and 2C are top-view, top-view and cross-sectional side-view schematics, respectively, illustrating the components and assembly of one of the solar panels.

FIGS. 5A, 5B, 5C and 5D are top-view schematics and FIG. 5E is a cross-sectional side-view schematic providing greater detail on electrical connections to the solar cells.

DETAILED DESCRIPTION

Figure 2C:
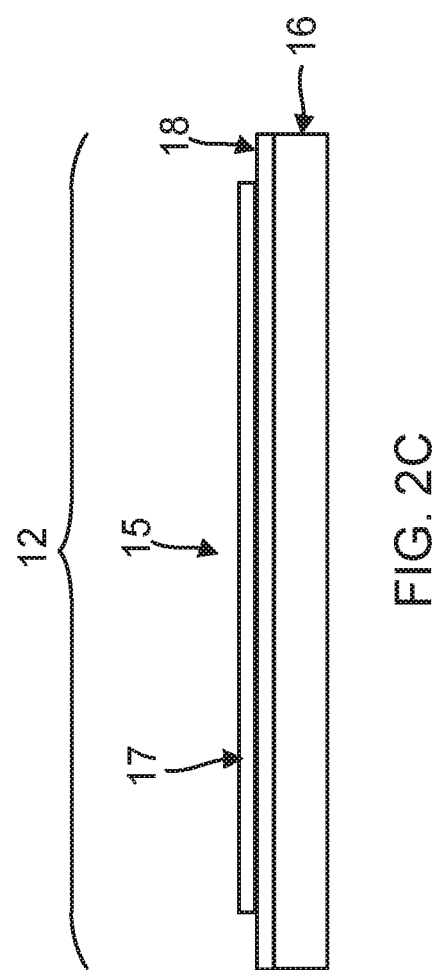

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

Overview

This disclosure provides a "flex on frame" concept for solar arrays, wherein a solar array includes at least one solar panel comprised one or more solar cells bonded onto a substrate, which may be a flexible substrate, and the substrate with the solar cells is then attached to a rigid support frame having a cutout or opening in a center of the frame under the solar cells. The substrate is thin to facilitate heat flow and thus it has a low stiffness that may bend and warp, making it unsuitable for flight alone. The substrate is attached to the frame that provides the stiffness for the structure to be used as a solar panel.

An advantage of the "flex on frame" concept for solar arrays is the cutout or opening in the frame. The cutout or opening enables the substrate to become the radiator into space, thus eliminating the typical thick rigid panel from the heat flow to the radiating surface.

Thermal connection to the frame is not required, thereby simplifying attachment of the substrate to the panel (e.g., simple mechanical fasteners or clamps). This differs from using a solid substrate or other material (e.g., metal plate) meant to transfer heat away from the solar cells.

By having such a cutout or opening, the frame does not take part in thermal transport from the solar cells; instead, the frame provides mechanical support for the substrate with the solar cells bonded thereon. This enables separation of thermal and mechanical roles.

This configuration eliminates the need for a multifunctional adhesive, which is difficult to work with during assembly of the solar panel and may breakdown over time during operation from exposure to the space environment.

In one alternative, optional reinforcing materials or support members may fill or cross the cutout or opening of the frame and the substrate with the solar cells bonded thereon is then attached to these materials inside the frame. This may result in a more rigid solar panel.

Wiring for the solar cells may also wrap around the frame, which also may provide certain advantages. This may simplify and reduce the cost of electrically connecting the solar panels.

These and other novel aspects to the "flex on frame" concept are described in more detail below.

Technical Description

FIG. 1 is a schematic of a spacecraft 10 with one or more solar arrays 11 comprised of one or more solar panels 12. In this example, the spacecraft 10 comprises a satellite, and there are two (2) solar arrays 11, and four (4) solar panels 12, wherein each of the solar arrays 11 is comprised of two of the solar panels 12, and the solar arrays 11 and solar panels 12 extend on both sides of the spacecraft 10. The solar arrays 11 are attached to the spacecraft 10 by means of triangular trusses 13 or other mechanisms, and each of the solar panels 12 is attached to an adjacent solar panel 12 by means of hinges 14 or other mechanisms, wherein the triangular trusses 13 and hinges 14 allow the solar arrays 11 and solar panels 12 to be folded and stacked for storage during launch, and then extended and deployed during operation.

FIGS. 2A, 2B and 2C are top-view, top-view and cross-sectional side-view schematics, respectively, illustrating the components and assembly of one of the solar panels 12, including a solar power module (SPM) 15 and a frame 16.

FIG. 2A shows the SPM 15, which is comprised of an array of solar cells 17 bonded to a substrate 18. In one example, the substrate 18 is a flexible substrate, namely, a flex circuit comprised of a laminate of one or more Kapton™ insulating layers and one or more metal layers providing electrical interconnects.

FIG. 2B shows the frame 16 for supporting the solar cells 17 and substrate 18, wherein the frame 16 is a rectangular structure formed, for example, of joined pieces defining a perimeter around a cut-out or opening in a center of the frame 16 under the solar cells 17.

FIG. 2C shows the SPM 15 mounted on and attached to the frame 16, wherein the substrate 18 is attached to the frame 16 at a perimeter of the frame 16 along one or more edges of the substrate 18. Once mounted and attached, the SPM 15 and frame 16 comprise a solar panel 12.

A conventional rigid solar panel is a solid shape, often rectangular, but can be any shape. In this disclosure, the solar panel 12 is largely hollow due to the configuration of the frame 16.

In this example, the substrate 18 is a thermal structure for radiating heat from the solar cells 17 into outer space, and the frame 16 is a mechanical structure for supporting the solar cells 17 and the substrate 18. Specifically, the cutout or opening at the center of the frame 16 enables cooling of the solar cells 17 through the substrate 18 by exposing a back side of the substrate 18 for transferring or radiating heat directly through the cutout or opening of the frame 16. The goal is for the radiated heat flow of the solar cells 17 and the substrate 18 to outer space to be minimally shadowed by the mechanical structure of the frame 16.

In another example, it is possible to have reinforcing materials and/or supporting members (not shown) inside the frame 16 to increase stiffness, wherein the reinforcing materials could be mesh, honeycomb material, or the like, and the supporting members could be various bars, channels, or the like. This is described in more detail below in conjunction with FIGS. 6A and 6B.

Figure 3A:
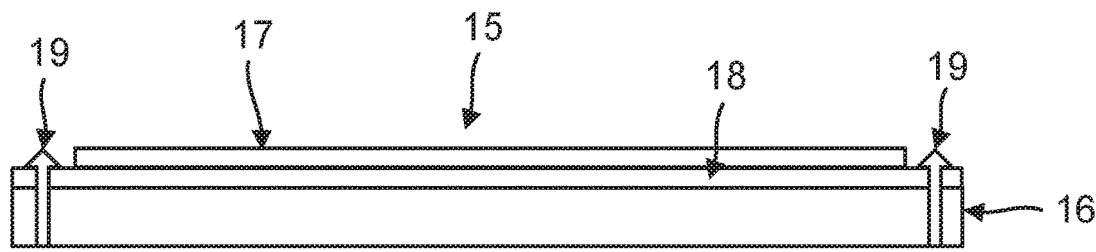
FIGS. 3A and 3B are a cross-sectional side-view schematic and a top-view schematic, respectively, of the substrate attached to the frame using one or more fasteners.
Figure 3B:
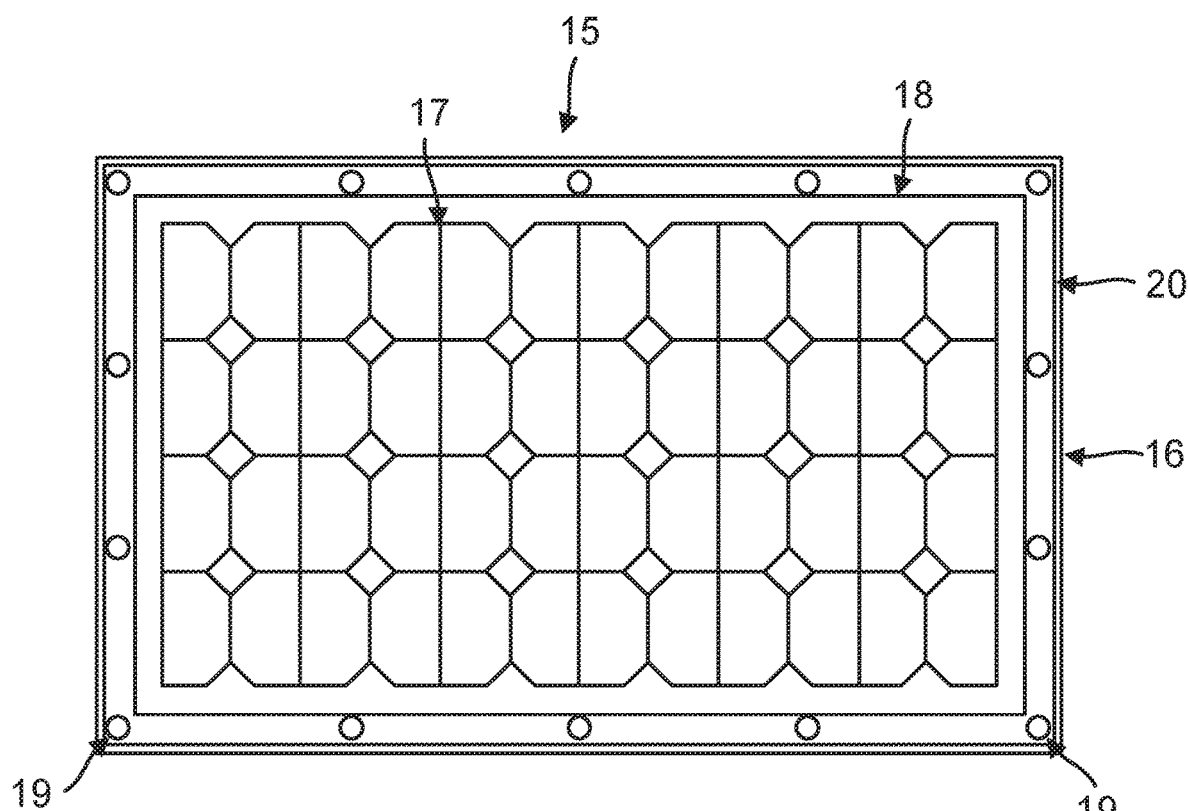

FIGS. 3A and 3B are a cross-sectional side-view schematic and a top-view schematic, respectively, of the SPM 15, frame 16, solar cells 17 and substrate 18, wherein the substrate 18 is attached to the frame 16 using one or more fasteners 19 and reinforced areas 20.

A wide variety of fasteners 19 can be used, including pins, posts, rivets or other structures, and the fasteners 19 may be comprised of metal, polymer, or other types of materials. Adhesives of various types could be used with the fasteners 19, or as an alternative to the fasteners 19, with continuous or spot application.

The fasteners 19 may attach to a single surface of the frame 16 or extend through the frame 16. It may be desirable that the fasteners 19 are reversible to allow disassembly for repairs, and reversing the fasteners 19 could involve destroying them, such as in cutting or drilling the fasteners 19, which should not be a major concern due to their low cost.

As shown in FIG. 3B, the fasteners 19 may be placed in reinforced areas 20 of the substrate 18 near the edges of the substrate 18, or in other areas of the substrate 18, to prevent tearing of the substrate 18. The reinforced areas 20 may be comprised of additional Kapton™ insulating layers, carbon fiber, Kevlar™, and/or metal layers, or some other combination of layers, or some other material. It would be rather straightforward to pattern a copper (Cu) trace layer as a reinforcement. Additionally, the frame 16 material may also be reinforced in proximity to the fasteners 19.

In this example, four (4) or five (5) of the fasteners 19 are positioned on each of the four (4) sides of the frame 16, around the perimeter of the frame 16, and near the edges of the substrate 18. In other examples, it may only be necessary to attach the SPM 15 to two (2) opposing sides of the frame 16. On the other hand, attaching the SPM 15 to all four (4) sides of the frame 16 does offer assurances regarding the security of the attachment of the SPM 15 to the frame 16.

Figure 4A:
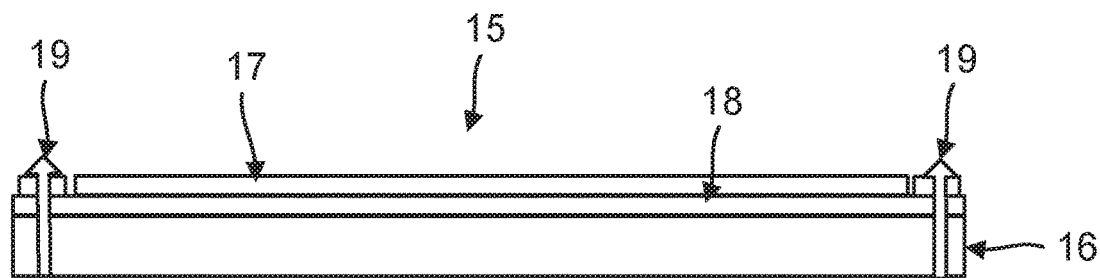
FIGS. 4A and 4B are a cross-sectional side-view schematic and a top-view schematic, respectively, of the substrate attached to the frame using one or more bars located along one or more sides of the frame.
Figure 4B:
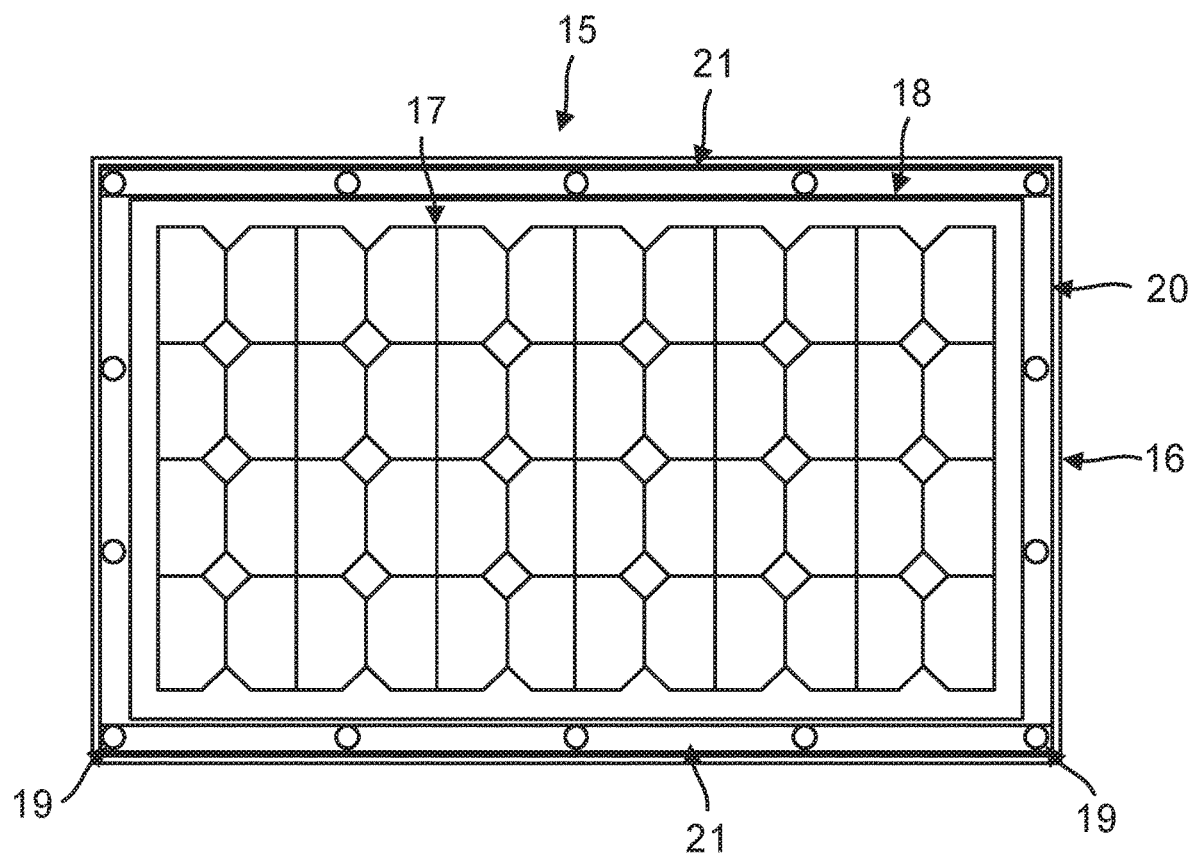

FIGS. 4A and 4B are a cross-sectional side-view schematic and a top-view schematic, respectively, of the SPM 15, frame 16, solar cells 17, substrate 18, fasteners 19 and reinforced areas 20, wherein the substrate 18 is attached to the frame 16 using one or more bars 21 located along one or more sides of the frame 16, for example, in the reinforced areas 20 near the edges of the substrate 18 and between at least some of the fasteners 19 and the substrate 18. These bars 21 serve to spread the force applied by the fasteners 19 and thus minimize the risk of tearing the substrate 18. These bars 21 could be rectangular or another shape, preferably matching the geometry of the frame 16. The bars 21 could also be comprised of a series of one or more shorter segments. FIG. 3B illustrates reinforcement at a single attachment position, while FIG. 4B illustrates reinforcement that spans multiple attachment positions.

Figure 5A:
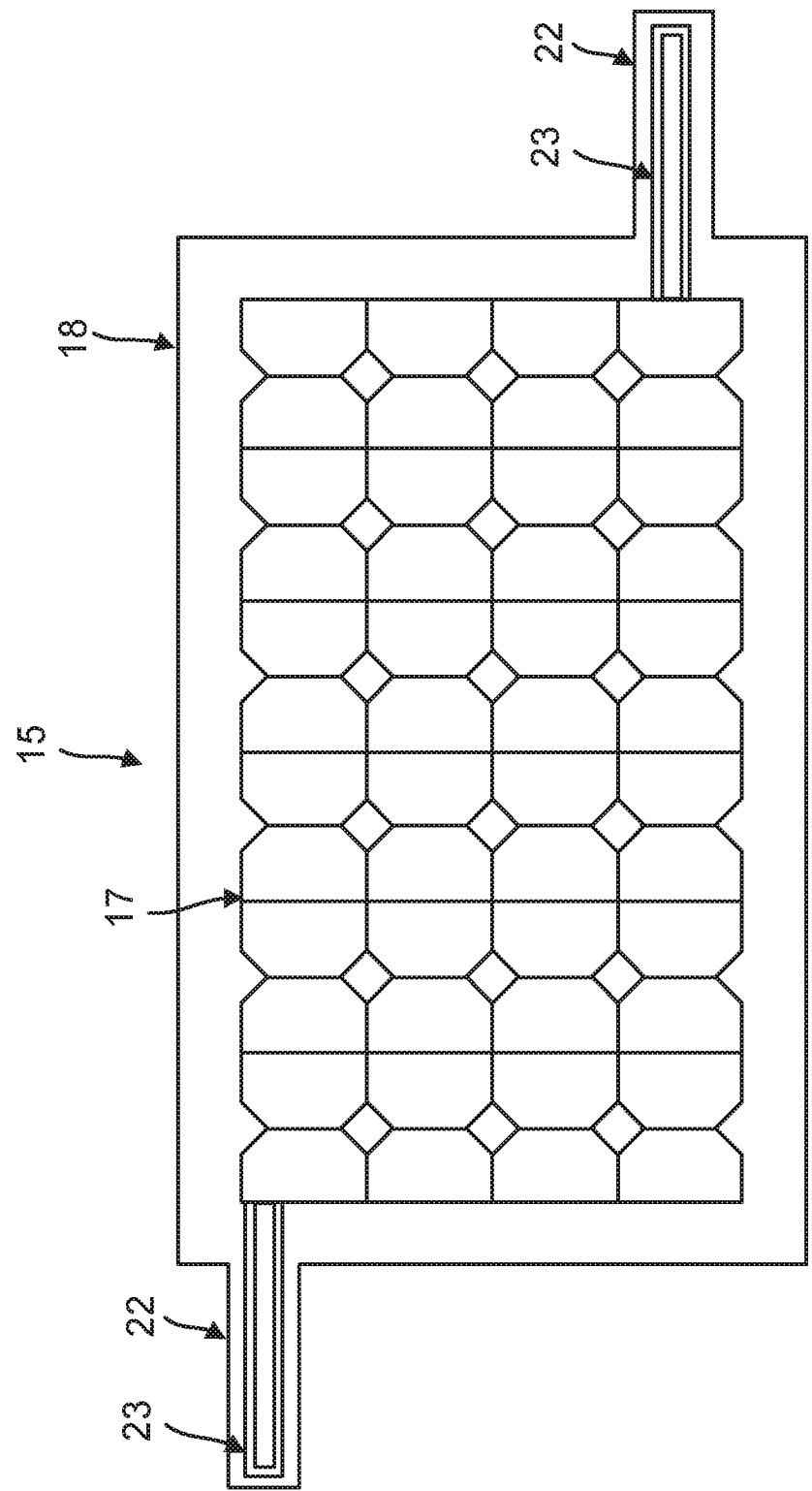

FIGS. 5A, 5B, 5C and 5D are top-view schematics and FIG. 5E is a cross-sectional side-view schematic providing greater detail on electrical connections to the solar cells 17. It is preferred that wiring for the electrical connections to the solar cells 17 be on a back side of the substrate 18, so that as much area as possible on the front side of the solar cells 17 is used to collect the Sun's energy.

FIG. 5A is a top-view schematic of the SPM 15, solar cells 17 and substrate 18, before being mounted on and attached to the frame 16, wherein the substrate 18 has one or more tabs 22 extending from one or more sides of the substrate 18. Each of the tabs 22 may be comprised of the same materials as the substrate 18, and may be contiguous portions of the substrate 18. Each of the tabs 22 may include one or more electrical conductors 23, patterned from one or more metal layers deposited on a surface of the tabs 22 and/or buried within the layers of the tabs 22, for making electrical connections to at least one of the solar cells 17.

Figure 5B:
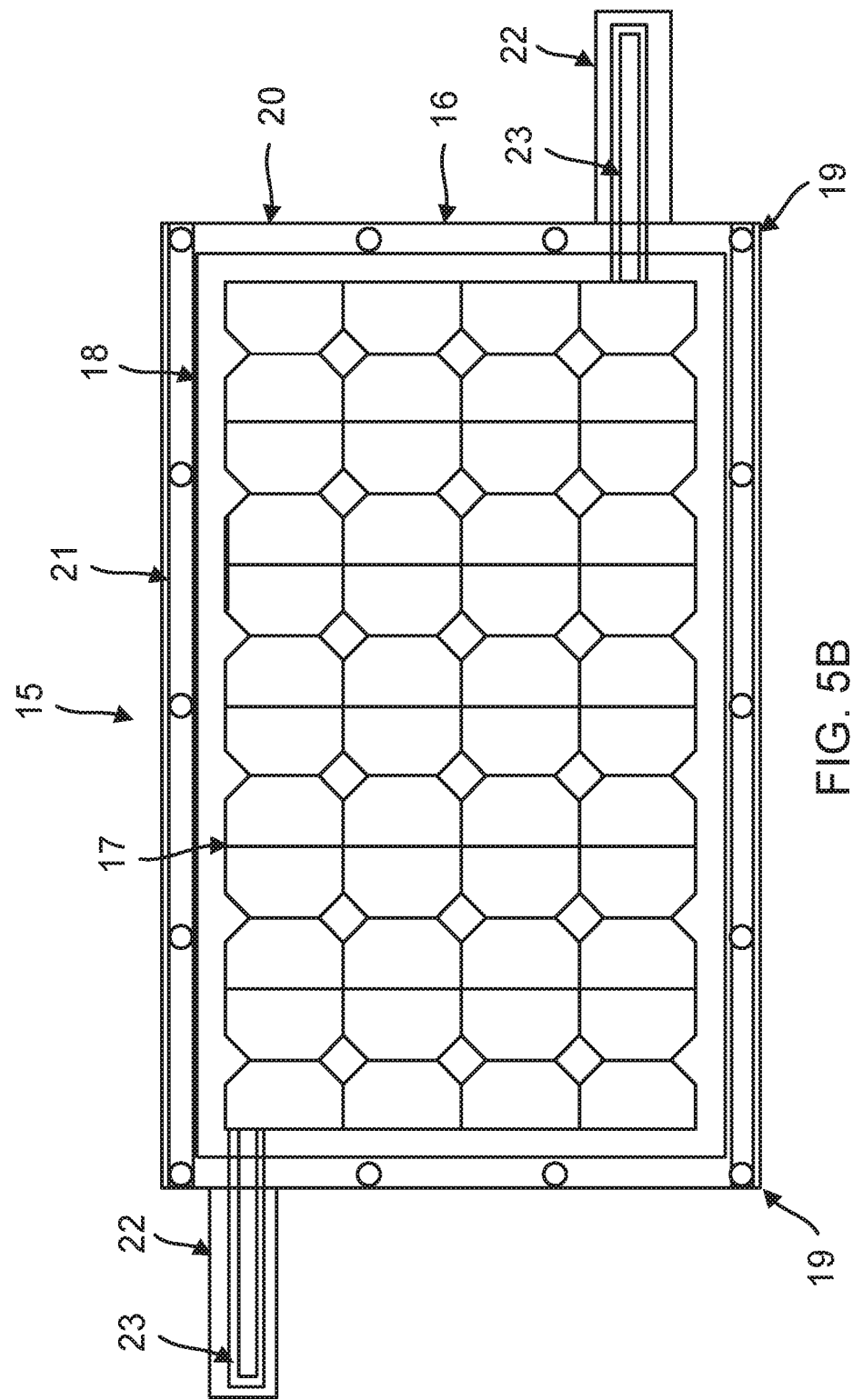

FIG. 5B is a top-view schematic of the SPM 15, frame 16, solar cells 17, substrate 18, fasteners 19, reinforced areas 20, and bars 21, wherein the substrate 18 is attached to the frame 16 with fasteners 19 at the reinforced areas 20 and bars 21, and the tabs 22 and electrical conductors 23 extend beyond the frame 16.

Figure 5C:
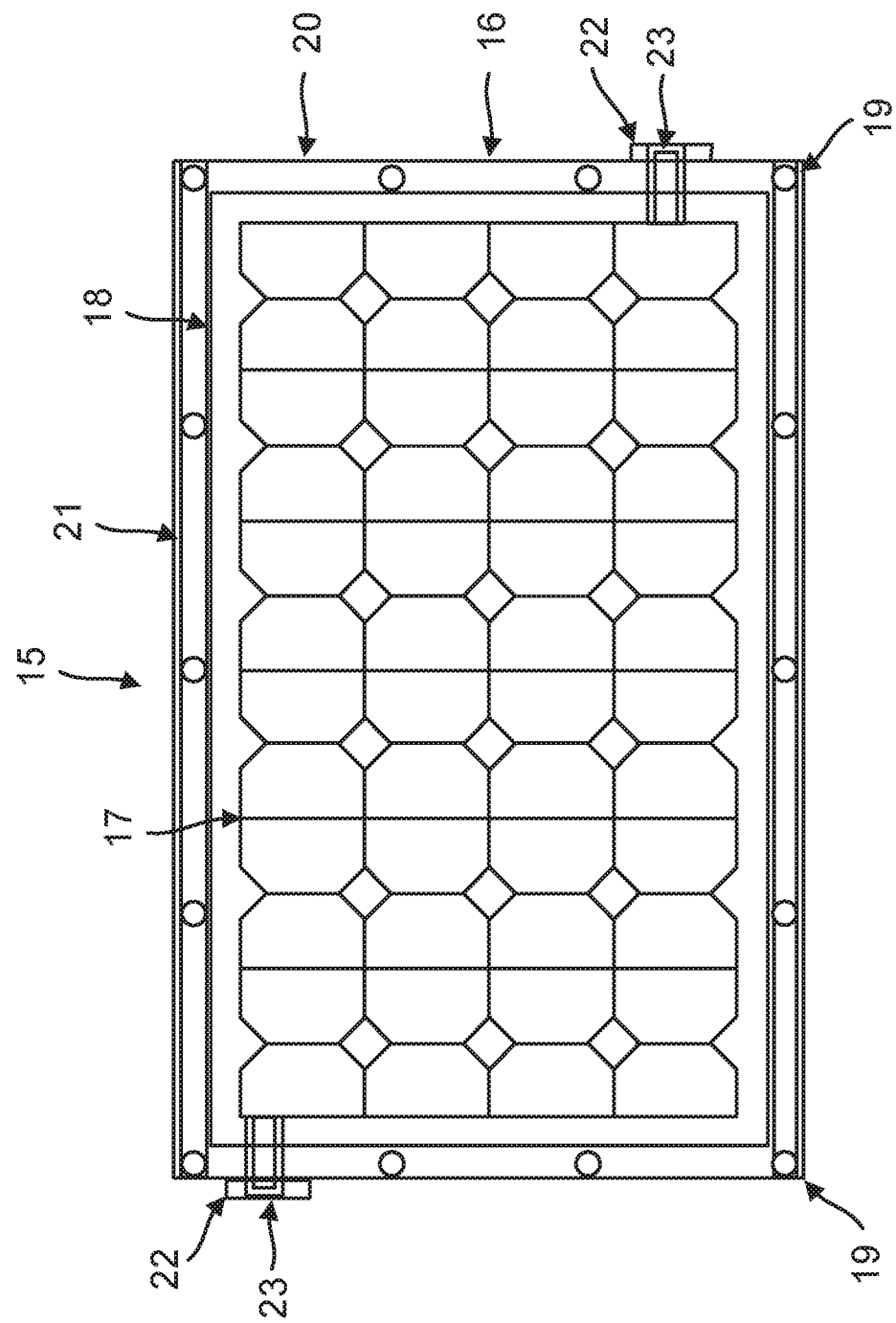

FIG. 5C is a top-view schematic of the SPM 15, frame 16, solar cells 17, substrate 18, fasteners 19, reinforced areas 20, and bars 21, wherein the tabs 22 and electrical conductors 23 are folded around and under the frame 16.

FIG. 5D is a bottom-view schematic of the frame 16, substrate 18, fasteners 19, and bars 21, wherein the tabs 22 and electrical conductors 23 are folded around and under the frame 16, and the tabs 22 are attached to the back side of the substrate 18, for example, with adhesive, fasteners, bars, or the like. The tabs 22 could also be attached to one or more sides of the frame 16, including the bottom side, front side and perimeter sides of the frame 16.

In this example, the tabs 22 extend around the outside of the frame 16, and then pass under and are secured by the bars 21. Another option could be to pass the tabs 22 through a slot or channel in the frame 16. In yet another option, the substrate 18 could be structured to end at the opening of the frame 16, which would allow the tabs 22 to fold down inside the frame 16, instead of outside the edge of the frame 16. In still another option, the tabs 22 could also be attached to one or more sides of the frame 16 and simply extend back away from the Sun.

The electrical conductors 23 may be electrically connected to conductors or traces (not shown) deposited on the back side of the substrate 18 and/or buried within the substrate 18, through the use of exposed conductors or traces, vias and the like.

FIG. 5E is a cross-sectional side-view schematic of the SPM 15, frame 16, solar cells 17, substrate 18, fasteners 19, bars 21 and tabs 22, wherein the tabs 22 are wrapped around the frame 16 to the back side of the substrate 18. Alternatively, the tabs 22 could be attached to the perimeter of the frame 16.

Here, the substrate 18 is visible on the top side of the frame 16 and bends around the outside of the frame 16. Preferably, the tabs 22 are positioned to have minimal shadowing of the radiation from the back side of the substrate 18. For example, the tabs 22 could be positioned behind the structure of the frame 16 to minimize shadowing.

The ends of the tabs 22 are available to make connections to other electrical conductors, such as a wiring harness (not shown), to carry power to adjacent frames 16, panels 12, arrays 11, other structures, and the spacecraft 10 itself. For example, the wiring harness may be positioned along the back of the substrate 18, the back of the frame 16, or the side of the frame 16. The wiring harness may extend partially or completely inside the frame 16 when the frame 16 is comprised of hollow members. The electrical conductors in the wiring harness may form part of the frame 16 when the frame 16 is constructed as a composite or through additive manufacturing.

Figure 6A:
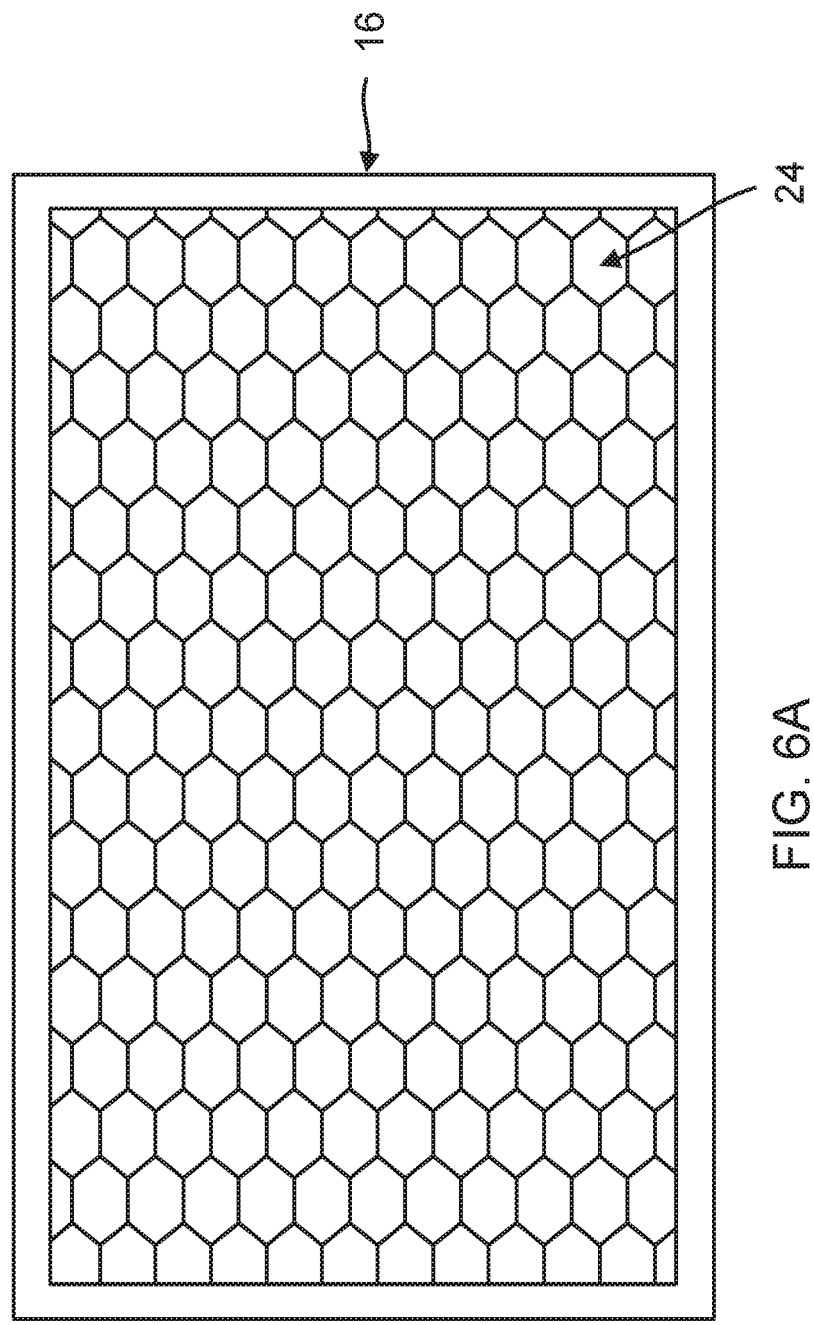
FIG. 6A is a top-view schematic and FIG. 6B is a cross-sectional side-view schematic illustrating reinforcing materials that may be used to fill the center of the frame.
Figure 6B:
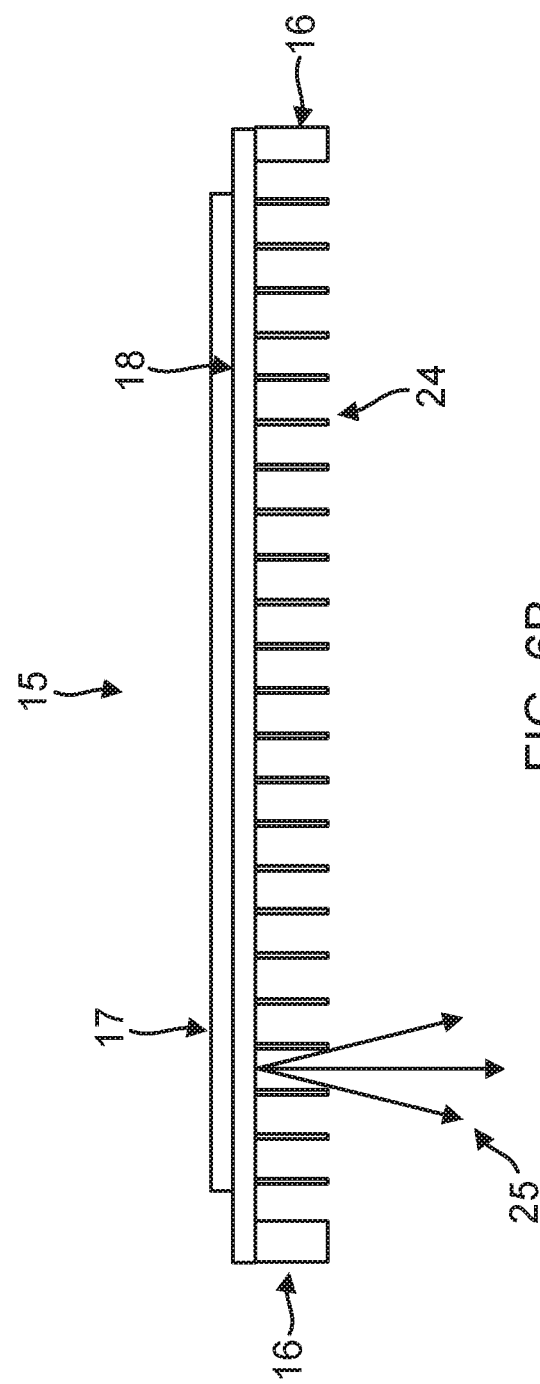

FIG. 6A is a top-view schematic and FIG. 6B is a cross-sectional side-view schematic illustrating reinforcing materials 24 that may be used to fill the cutout or opening in the center of the frame 16, wherein FIG. 6A shows only the frame 16 and the reinforcing materials 24, and FIG. 6B shows the SPM 15 mounted on and attached to the frame 16, with the substrate 18 attached to both the frame 16 and the reinforcing materials 24, the solar cells 17 bonded to the substrate 18 above the reinforcing materials 24.

In one example, these reinforcing materials 24 may be designed to allow radiation at normal incidence to reach the solar cells 17, and to block radiation at non-normal incidence from reaching the solar cells 17. For example, space radiation (e.g., electrons, protons, gamma rays) bombards the solar array 11 and solar panels 12 at all angles. The use of a honeycomb structure as the reinforcing materials 24 in the frame 16 can be used to block the space radiation at non-normal incidence, and thus shield the solar cells 17 from damage, while allowing radiative cooling 25 to occur at normal incidence.

It is important for the solar panel 12 to pass acoustic and vibration testing. Attachment of the substrate 18 to the reinforcing materials 24 below the substrate 18 can limit vibrations and improve survivability. Acoustic and vibration environment occurs during the launch phase, while the solar panels 12 are folded and stowed against the side of the spacecraft 10. In this condition, the solar cells 17 from one panel 12 may be facing the reinforcing materials 24 from a second panel 12. Their mechanical engagement should be designed to withstand the acoustic and vibration requirements. Employing shock absorbing or soft materials such as foam between the solar cells 12 or substrate 18 and the reinforcing materials 24 of the next panel 12 would be advantageous.

Functional Block Diagram

Figure 7:
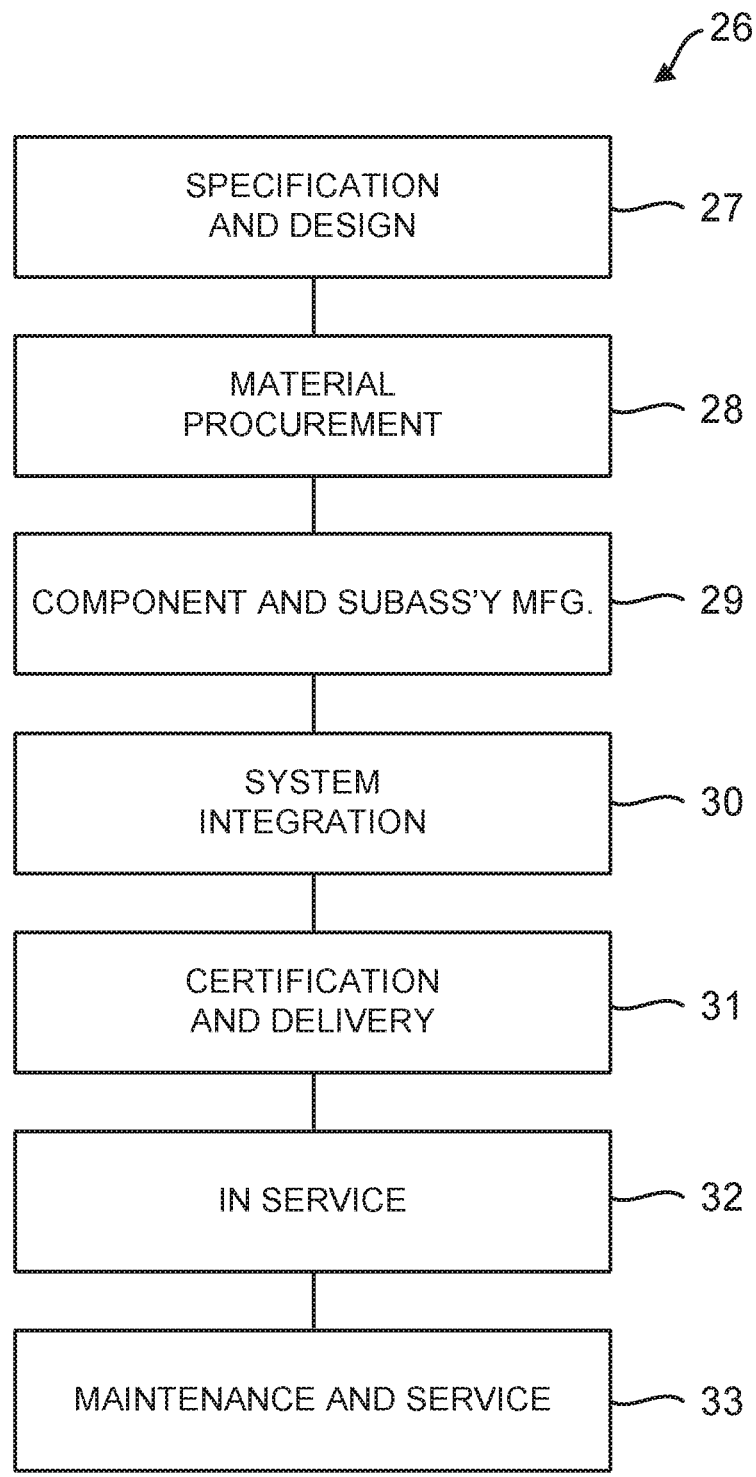
FIG. 7 illustrates a method of fabricating an apparatus comprising a solar array for a spacecraft.
Figure 8:
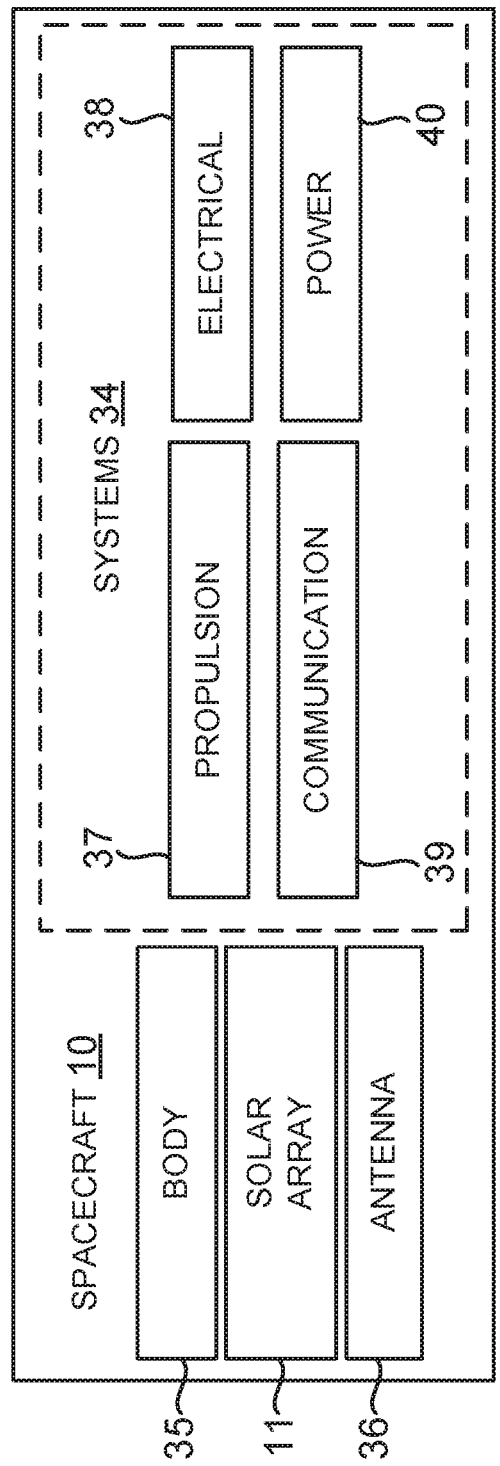
FIG. 8 illustrates the resulting apparatus comprising a spacecraft with a solar array.

Examples of the disclosure may be described in the context of a method 26 of fabricating an apparatus comprising the solar array 11 for the spacecraft 10, the method 26 comprising steps 27-33, as shown in FIG. 7, wherein the resulting spacecraft 10 having the solar array 11 is shown in FIG. 8.

As illustrated in FIG. 7, during pre-production, exemplary method 26 may include specification and design 27 of the spacecraft 10 and/or solar array 11, and material procurement 28 for same. During production, component and subassembly manufacturing 29 and system integration 30 of the spacecraft 10 and/or solar array 11 takes place, which include fabricating the spacecraft 10 and/or solar array 11, including bonding one or more solar cells 17 to the substrate 18, and then attaching the substrate 18 and the solar cells 17 to a frame 16 for support. Thereafter, the spacecraft 10 and/or solar array 11 may go through certification and delivery 31 in order to be placed in service 32. The spacecraft 10 and/or solar array 11 may also be scheduled for maintenance and service 33 (which includes modification, reconfiguration, refurbishment, and so on), before being launched.

Each of the processes of method 26 may be performed or carried out by a system integrator, a third party, and/or an operator (e.g., a customer). For the purposes of this description, a system integrator can include without limitation any number of solar cell 17, solar panel 12, solar array 11 or spacecraft 10 manufacturers and major-system subcontractors; a third party may include without limitation any number of venders, subcontractors, and suppliers; and an operator may be a satellite company, military entity, service organization, and so on.

As shown in FIG. 8, a spacecraft 10 fabricated by exemplary method 26 can include systems 34, a body 35, one or more solar arrays 11, and one or more antennae 36. Examples of the systems 34 included with the spacecraft 10 include, but are not limited to, one or more of a propulsion system 37, an electrical system 38, a communications system 39, and a power system 40. Any number of other systems 34 also may be included.

Figure 9:
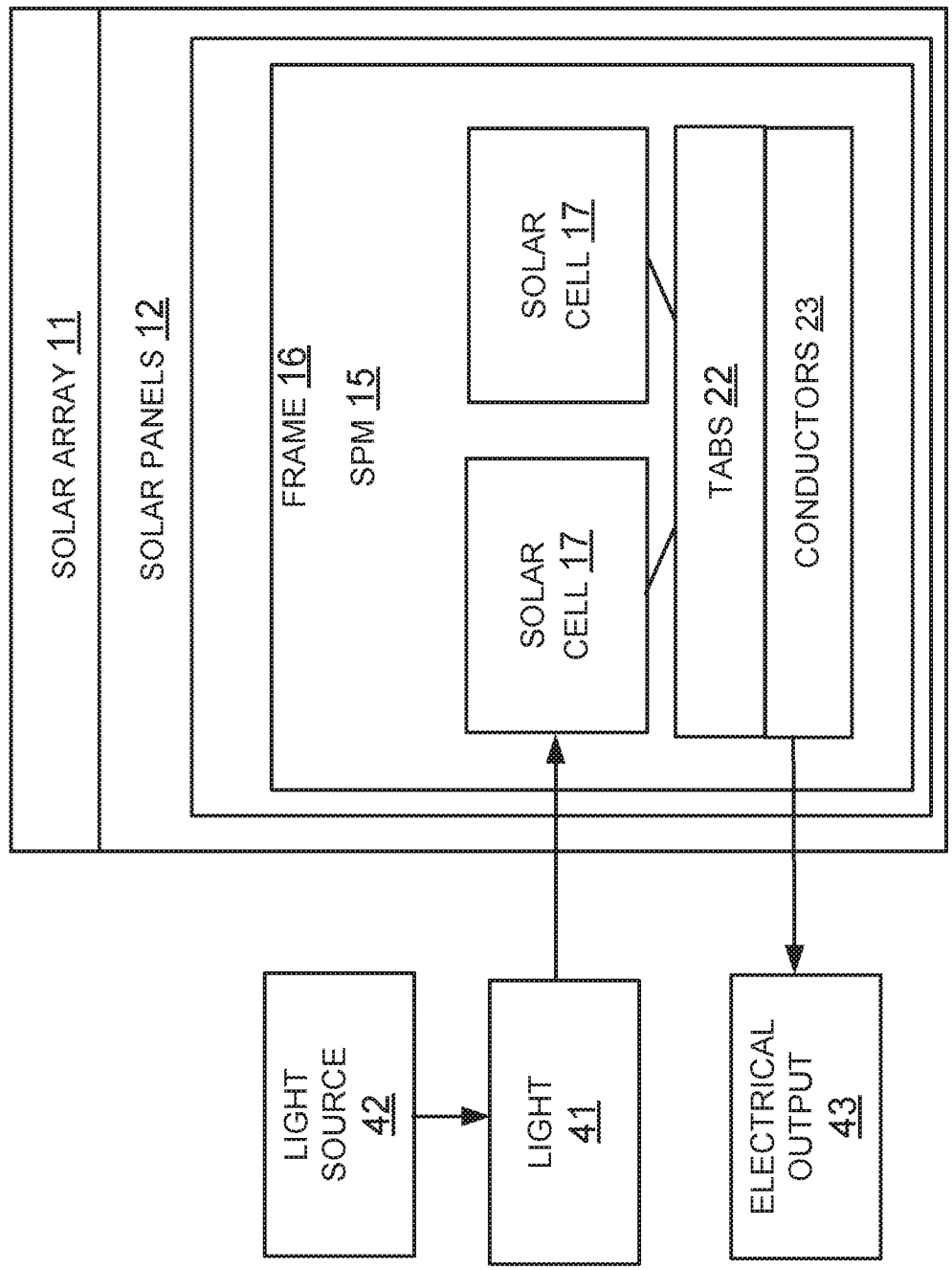
FIG. 9 is an illustration of a method of deploying and operating the solar array, in the form of a functional block diagram.

FIG. 9 is an illustration of a method of stowing, deploying and operating the solar array 11, in the form of a functional block diagram, according to one example.

When stowed and deployed, the solar array 11 is comprised of one or more solar panels 12, wherein each of the solar panels 12 includes one or more of the SPMs 15. Each of the SPMs 15 is comprised of a substrate 18, which may be a flexible substrate 18, having one or more solar cells 17 bonded thereto; and a frame 16 for supporting the substrate 18 and the solar cells 17, wherein the frame 16 supports the substrate 18 at a perimeter of the frame 16 along one or more edges of the substrate 18, the frame 16 has a cutout or opening in a center of the frame 16 under the solar cells 17, and the cutout or opening enables cooling of the solar cells 17 through the substrate 18 by exposing a back side of the substrate 18 for transferring or radiating heat from one or more solar cells 17 bonded to the substrate 18 directly through the cutout or opening of the frame 16.

When operating, each of the solar cells 17 absorbs light 41 from a light source 42 and generates an electrical output 43 in response thereto, which results in excess heat being generated by the solar cells 17.

The substrate 18 may have one or more conducting layers for making electrical connections to the solar cells 17, one or more insulating layers for insulating the conducting layers, and the conducting layers may be embedded in the substrate 18 and/or are on the substrate 18.

The substrate 18 may be attached to the frame 16 using one or more fasteners 19, and the fasteners 19 may be placed in reinforced areas 20 of the substrate 18 near edges of the substrate 18 to prevent tearing of the substrate 18. The substrate 18 may be attached to the frame 16 using one or more bars 21 located along one or more sides of the frame 16 to spread a force applied by fasteners 19 attaching the substrate 18 to the frame 16.

The substrate 18 may have one or more tabs 22 that are folded around and under the frame 16, and the tabs 22 may be attached to the back side of the substrate 18. The tabs 22 may include one or more electrical conductors 23 for making electrical connections to the solar cells 17. The tabs 22 may be attached to one or more sides of the frame 16.

Reinforcing materials 24 or support members may fill the cutout or opening of the frame 16, and the substrate 18 with the solar cells 17 may be attached to the reinforcing materials 24 inside the frame 16. The reinforcing materials 24 may incorporate shock absorbing materials to interface with the substrate 18 and solar cells 17 while stowed. The reinforcing materials 24 also may allow radiation at normal incidence to reach the solar cells 17, and may block radiation at non-normal incidence from reaching the solar cells 17.

CONCLUSION

The description of the examples set forth above has been presented for purposes of illustration and description, and is not intended to be exhaustive or limited to the examples described. Many alternatives, modifications and variations may be used in place of the specific elements described above.

What is claimed is:

1. An apparatus, comprising:
a substrate having one or more solar cells bonded thereto; and
a frame for supporting the substrate and the solar cells, wherein the frame is a rectangular structure defining a perimeter around a cutout or opening under the solar cells, the substrate is attached to the frame at each side of the frame, only around the perimeter of the frame, along one or more edges of the substrate, the cutout or opening enables direct cooling of the solar cells through the substrate by exposing a back side of the substrate and the solar cells for transferring or radiating heat directly through the cutout or opening of the frame, reinforcing materials are in the cutout or opening of the frame, and the reinforcing materials allow radiative cooling at normal incidence from the solar cells, and block electron and proton radiation at non-normal incidence from reaching the solar cells.

2. The apparatus of claim 1, wherein the substrate is a flexible substrate.

3. The apparatus of claim 1, wherein the substrate is attached to the frame using one or more fasteners, and the fasteners are placed in reinforced areas of the substrate to prevent tearing of the substrate.

4. The apparatus of claim 1, wherein the substrate is attached to the frame using one or more bars located along one or more sides of the frame to spread a force applied by fasteners attaching the substrate to the frame.

5. The apparatus of claim 1, wherein the substrate has one or more tabs that are folded around and under the frame.

6. The apparatus of claim 5, wherein the tabs include one or more electrical conductors for making electrical connections to the solar cells.

7. The apparatus of claim 5, wherein the tabs are attached to one or more sides of the frame.

8. The apparatus of claim 1, further comprising support members in the cutout or opening of the frame.

9. The apparatus of claim 1, wherein the reinforcing materials incorporate shock absorbing materials to interface with the substrate and solar cells while stowed.

10. The apparatus of claim 1, wherein the substrate has one or more conducting layers for making electrical connections to the solar cells, the substrate includes one or more insulating layers for insulating the conducting layers, and the conducting layers are embedded in the substrate or are on the substrate.

11. The apparatus of claim 1, wherein the frame, substrate, and solar cells comprise a solar panel for a spacecraft.

12. A method, comprising:
bonding one or more solar cells to a substrate; and
attaching the substrate and the solar cells to a frame for support, wherein the frame is a rectangular structure defining a perimeter around a cutout or opening under the solar cells, the substrate is attached to the frame at each side of the frame, only around the perimeter of the frame, along one or more edges of the substrate, the cutout or opening enables direct cooling of the solar cells through the substrate by exposing a back side of the substrate for transferring or radiating heat directly through the cutout or opening of the frame, reinforcing materials are in the cutout or opening of the frame, and the reinforcing materials allow radiative cooling at normal incidence from the solar cells, and block electron and proton radiation at non-normal incidence from reaching the solar cells.

13. The method of claim 12, wherein the substrate is a flexible substrate.

14. The method of claim 12, wherein the substrate is attached to the frame using one or more fasteners, and the fasteners are placed in reinforced areas of the substrate to prevent tearing of the substrate.

15. The method of claim 12, wherein the substrate is attached to the frame using one or more bars located along one or more sides of the frame to spread a force applied by fasteners attaching the substrate to the frame.

16. The method of claim 12, wherein the substrate has one or more tabs that are folded around and under the frame, the tabs include one or more electrical conductors for making electrical connections to the solar cells.

17. The method of claim 16, wherein the tabs are attached to one or more sides of the frame.

18. The method of claim 12, wherein the reinforcing materials incorporate shock absorbing materials to interface with the substrate and solar cells while stowed.

19. The method of claim 12, wherein the substrate has one or more conducting layers for making electrical connections to the solar cells, the substrate includes one or more insulating layers for insulating the conducting layers, and the conducting layers are embedded in the substrate or are on the substrate.

20. A method, comprising:
transferring heat from one or more solar cells bonded to a substrate, wherein the substrate is mounted on a frame for support, the frame is a rectangular structure defining a perimeter around a cutout or opening under the solar cells, the substrate is attached to the frame at each side of the frame, only around the perimeter of the frame, along one or more edges of the substrate, the cutout or opening enables direct cooling of the solar cells through the substrate by exposing a back side of the substrate for radiating heat directly through the cutout or opening of the frame reinforcing materials are in the cutout or opening of the frame, and the reinforcing materials allow radiative cooling at normal incidence from the solar cells, and block electron and proton radiation at non-normal incidence from reaching the solar cells.

\* \* \* \* \*